United States Patent
D'Ostilio

[11] Patent Number: 5,999,067
[45] Date of Patent: Dec. 7, 1999

[54] HIGH PERFORMANCE RF/MICROWAVE FILTERS FOR SURFACE MOUNT TECHNOLOGY WITH A SHIELDING METAL BRACKET

[76] Inventor: James Phillip D'Ostilio, 1110 Fidler La., Apt. 602, Silver Spring, Md. 20910

[21] Appl. No.: 09/013,100

[22] Filed: Jan. 26, 1998

[51] Int. Cl.⁶ .................................................. H03H 7/01
[52] U.S. Cl. ........................ 333/185; 361/813; 361/818
[58] Field of Search ................................ 333/167, 185; 361/813, 818, 821

[56] References Cited

U.S. PATENT DOCUMENTS

| | | | |
|---|---|---|---|
| 3,251,015 | 5/1966 | Denham | 336/96 |
| 4,213,106 | 7/1980 | Tunematu et al. | 333/185 |
| 5,274,346 | 12/1993 | Izu et al. | 333/185 X |
| 5,621,363 | 4/1997 | Ogden et al. | 333/182 X |

Primary Examiner—Justin P. Bettendorf
Attorney, Agent, or Firm—Burns, Doane, Swecker & Mathis, L.L.P.

[57] ABSTRACT

The present invention provides filters configured for use in surface mount technology (SMT). The high performance SMT filters of the present invention are formed of an exterior housing surrounding a smaller, similarly configured metal bracket. Electrically connected to the interior of the metal bracket are the filter internal components. Inside the metal bracket, and surrounding the filter internal components, is a solidified void-filling material such as epoxy. The ground leads of the filter are an integral part of the metal bracket giving excellent ground connection from the filter internal components to the surface mount circuit board. The high performance SMT filters of the present invention are especially adaptable to highly automated, high-throughput manufacturing techniques.

10 Claims, 2 Drawing Sheets

Bracket Prior to Assembly and Lead Shear

Bracket Prior to Assembly and Lead Shear

HIGH PERFORMANCE RF/MICROWAVE FILTERS FOR SURFACE MOUNT TECHNOLOGY WITH A SHIELDING METAL BRACKET

FIELD OF THE INVENTION

The present invention provides high performance surface mounted RF/microwave filters useful in the manufacture of printed circuit board assemblies and the like. The invention further provides efficient methods of manufacturing such surface mounted filters with high throughput.

BACKGROUND

In the field of circuit board construction and technology, filter components have traditionally been attached to the board with through-hole technology. Through-hole technology, however is both costly and time consuming in that it requires the internal parts of a filter to be soldered or screwed into an enclosure, and this enclosure affixed to the circuit board with its leads extending through holes in the circuit board. Accordingly, there is a move away from the use of through-hole technology to surface mounted technology (SMT). SMT avails the use of automated manufacturing techniques that are fast and efficient. Accordingly, for purposes of automation and increased through-put, it is desirable to create RF/microwave filters that can be readily mounted on the surface of the circuit board.

With the development of wireless communication technology and the rapid expansion of the associated industry, the demand for associated SMT components has increased dramatically. Among the components now in high demand are RF/microwave filters. Such high demand has necessitated automated assembly, testing and packing techniques. Manufacturers are seeking to increase their use of automated equipment to mount components onto circuit boards. Surface mountable filters, properly constructed, can help meet that need. However, automated manufacturing techniques applicable to the manufacture of the high performance type SMT filters themselves has been slow in coming.

A conventional technique involves assembling the internal components of the filter onto a header. The internal components are held in place temporarily and by use of a side lid allows testing and adjusting of the filter by access through the temporary side lid. Following adjustment, the internal components are fixed in place with a fixative compound that is manually applied to the components and the header. Finally, the final lid is affixed to the header and the outside of the filter header/lid connection is sealed. Affixing the adjustments is required so that the adjustments made will survive the handling the filter will experience in the end use in automated machinery. It is most desirable to use a full metal ground shield surrounding the internal components to keep noise from entering the filter and affecting the performance of the end user's application. Some filter manufacturers have eliminated a ground shield and lid in an effort to mass produce SMT filters, with the resulting degradation of overall filter performance.

Techniques such as the foregoing require several difficult-to-automate steps. Fixative material is generally introduced by hand, and can only contact the header as the side lids must be removable for the final lid, which encloses all sides thereby precluding access to the filter's internal components. Further, the header serves as a ground to the internal filter components as well as the external ground connection for the filter, per se.

SUMMARY OF THE INVENTION

The present invention solves the foregoing problems by mounting and soldering the internal filter components into a folded metal bracket that nests within a similarly configured housing. The components can be mounted in the metal bracket by automated pick and place machinery and soldered in place by robot soldering. Once the internal components are positioned within the bracket, which nests within the plastic housing, the filter is tested and internal components adjusted on test equipment. Following adjustment, the interior of the filter is filled with a void-filling material such as a temperature-matched fixative epoxy. Alternatively, the void filling material is any inert thermoset or thermoplastic polymer having properties compatible with the end use conditions to which the filter will likely be exposed. On introduction, the void filling material is liquid or of sufficiently low viscosity as to be injected or otherwise introduced into the internal void area of the filter so as to fill the void area and surround the internal components. The void filling material will then be allowed to solidify or subjected to such conditions as cause it to solidify. By "solidify" or "solid" is meant a physical state of sufficient viscosity as to avoid loss of any substantial quantities of said material through seepage or otherwise under conditions of normal use. The cured or set void-filling material thus surrounds, affixes, and structurally supports the adjusted internal components.

The resulting surface mountable filter is ready for placement on the surface of the circuit board. The ground plane of the circuit board serves as the ground connection for the filter.

Thus, it is an object of the present invention to provide a high performance surface mount RF/microwave filter that is fully shielded, durable, reliable, and amenable to automated manufacturing and testing techniques for low cost.

BRIEEF DESCRIPTION OF THE DRAWINGS

DETAILED DESCRIPTION OF THE INVENTION

Figure 1:
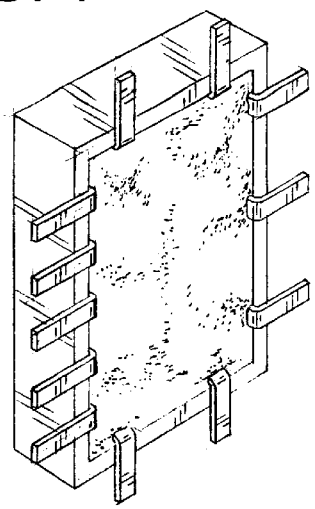
FIG. 1 is a view of the SMT filter of the present invention showing the bottom of the filter, the major surface of which represents the void-filling material and showing the conductive leads protruding from the bracket beneath said housing.
Figure 2:
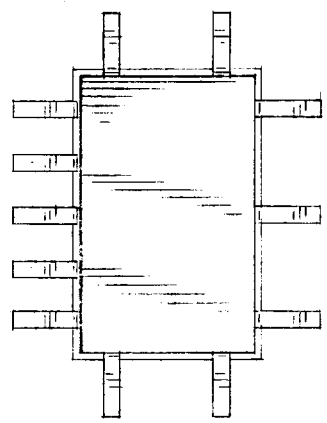
FIG. 2 is a bottom view of the metal bracket of the present invention.
Figure 3:
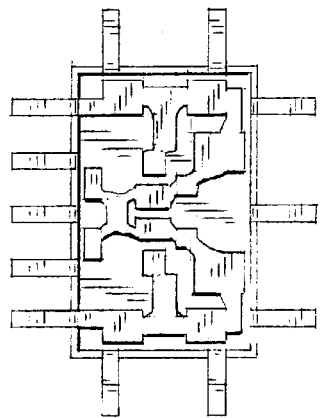
FIG. 3 is a bottom view of the bracket/filter subassembly illustrating the filter internal components and the conductive leads.
Figure 4:
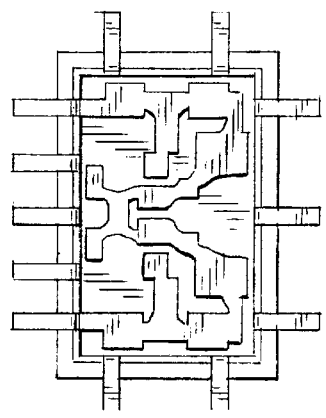
FIG. 4 is a bottom view of the bracket/filter subassembly nested within the external housing prior to introduction of the void-filling material.
Figure 5:
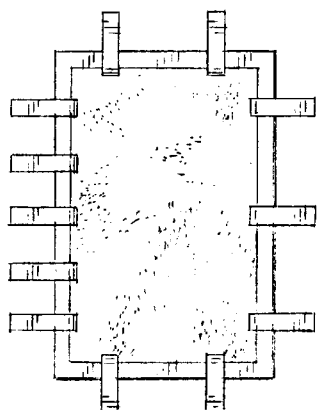
FIG. 5 is a bottom view of the completed filter illustrating the void filling material as the major surface, the conductive leads and external housing.

The present invention provides high performance surface mount RF/microwave filters suitable for use in, among other things, wireless communication devices. The present invention further provides methods for making such filters.

The SMT filters of the present invention are especially configured to facilitate high-throughput automated manufacturing techniques. The peculiar suitability of these devices for high-throughput manufacturing techniques will enable manufacturers to more readily meet the dramatically increasing demand for such items.

The methods of the present invention include forming a metal bracket having an access port; inserting said bracket within an external housing; inserting and affixing filter internal components inside said metal bracket; adjusting and testing the internal components through the access port; and filling the interior of the metal bracket with a void filling material.

The SMT filters of the present invention (1) comprise an exterior housing (2) surrounding a smaller, similarly configured metal bracket or can cover (3). Affixed to the interior of the metal bracket are the filter internal components (4). Inside the metal bracket, and surrounding the filter internal components, is a solidified void-filling material such as epoxy (5). More particularly, the present invention provides a surface-mount filter comprising: an external housing; a metal bracket; internal filter components; electrical leads; and inert, solidified void-filling material, wherein the housing surrounds the metal bracket; the filter internal components are affixed and electrically connected to the interior of the metal bracket; the inert void-filling material surrounds the filter internal components; and the electrical ground leads are an integral part of the metal bracket.

The housing (2) conforms to and substantially surrounds the metal bracket (3). Preferably, there will be minimal gap or void area between the housing and the bracket. The housing will preferably be made of an economical inert material such as plastic. A particularly preferred material is a polyether sulfone material, such as that commercially available as VECTRA®, see e.g., Technical Bulletin No. REI-95-1115 (Robison Electronics, Inc., 3580 Sacramento Drive, San Luis Obispo, Calif., 94083-8121, incorporated herein by reference.) The Vectra® material has a withstanding temperature of 254° C., to survive oven reflow soldering to the end user's circuit board. This material withstands 100 psi ultrasonic pressure washing and does not melt or flame.

Preferably, the metal bracket (3) is configured to nest squarely and snugly within the exterior housing or header (2). The bracket can be made of any material that has suitable electrical properties and shielding capabilities, and is capable of ready manufacture into desired configurations. Preferably, the bracket is made of thin metal ( approximately 0.010 inch thick brass—tin plated) to facilitate quick heat-up and soldering. It is contemplated, however, that the bracket can be made of other suitable materials (such as tin plated steel or phosphor bronze or nickel silver).

The shape of the metal bracket and conforming housing can be any suitable structural conformation capable of providing the desired footprint, shape and structural support. Suitable structures include any three-dimensional structure or housing having a central cavity such as a cup, dome, cylinder, or cube. The central cavity is configured to receive the filter internal components in the case of the metal bracket; and the metal bracket in the case of the exterior housing. The bracket with integral leads allows for differences in the rates of expansion of the end user's circuit board and metal bracket.

Once the SMT filter of the present invention is soldered down to the end user's circuit board, the filter is completely shielded. This is a novel and particularly advantageous feature as among filters having one open faced surface. The prior art method required the filter manufacturer to attach the lid and thus totally enclose the filter. However, the present invention, by using the end user's circuit board ground place as the "lid", achieves higher performance in achieving the ultimate stopband attenuation levels and stopband rejections. This is due to the integral ground path of the metal bracket inside surface to component connection and same metal bracket inside surface to circuit board connection and the metal bracket completely surrounding the internal components. This eliminates one boundry interface the prior art requires to achieve a good ground connection. That is, in the prior art the circuit board ground connection must contact the outside surface of the metal can, conduct through to the inside surface, conduct through from the inside surface to the components. The present invention once soldered to the end user's circuit board ground area, uses this circuit board ground area as one of its ground surfaces (or "lid") with no interfacial connections. It in this way achieves the ultimate attenuation levels greater than possible in the prior art. For example, a 10 MHz Low Pass Filter constructed achieves greater than 60 dB attenuation through 200 MHz, far exceeding what is offered in the prior art.

Another of the significant advantages of the present invention is the pliability of the leads in that they are an integral part of the folded metal bracket and bent at a nominal 90 degree angle relative to the housing. Over a wide temperature range, the bend at the lead of the metal bracket allows for differences of thermal expansion of the end user's circuit board and the filter. In the prior art, leads are vertical with the housing having no mechanism to allow for horizontal differences in expansion or are separately formed and attached to the housing, having the additional costs and poorer electrical ground connection.

A preferred structure for the bracket (3) and housing (2) is a polyhedron such as a hexahedron or cubic structure as illustrated in FIGS. 1–5. Such polyhedrons have a central cavity and might have sides of equal or unequal dimension.

Where the bracket and housing are in the shape of a polyhedron, the bracket and housing are initially formed from an open-faced polyhedron. By open-faced polyhedron is meant any such structure lacking physical structure corresponding to a side or a substantial portion of a side of the structure. The open-face of the polyhedron thus forms an access port to the interior of the filter. As shown in the Figures, the open face of the illustrated polyhedrons is a major surface corresponding to the bottom of the filter assembly.

The open faced polyhedrons of the bracket and housing are such that, as finally configured, they are substantially concentric and coplanar. The opening or access port allows adjustmaent of the filter internal components prior to the introduction of a void-filling material.

The internal components of the filter are affixed and electrically connected to the interior of the bracket, thus forming a bracket/filter subassembly. Preferably, the interior components are soldered to the metal bracket. Such interior components include chip capacitors, chip inductors, air wound coils, toroidal wound coils, all of which are commonly commercially available. These components are similar to those otherwise known as in Kling's U.S. Pat. No. 4,821,005 and in Bernstein's U.S. Pat. No. 4,714,905.

In one embodiment, the bracket is formed by folding a thin sheet of metal into an open-faced hexahedral or cubic structure. The thin sheet of metal can be folded by automated machinery from a metal sheet. Alternatively, the bracket might be molded or extruded, or stamped or etched from sheet.

The external housing preferably has the same shape as the metal bracket, but is of slightly larger scale. The central cavity of the external housing is sized and configured to receive the metal bracket. Thus, the external housing is sized uniquely for the metal bracket, and such that there is minimal gap or void area between the metal bracket and the external housing.

Selection of the shape of the external housing and metal bracket will necessarily take into account suitability for automated pick and place machinery. Thus, the external housing provides a receptacle and supporting structure for the bracket/filter subassembly during adjustment and testing of the internal components; a vessel for containment of the liquid void-filling material; and a uniform external structure for automated handling and smooth surface for part marking and handling.

Protruding from, and electrically a part of, the side walls of the bracket are a series of leads (6). The leads are used to mount and connect the filter to the ground plane of a circuit board. The leads are bent or configured perpendicular to the side from which they protrude such that they are substantially coplanar with the open faced side of the bracket and housing. As installed, the leads are preferably flush with the surface of the circuit board to which the filter is mounted.

Figure 6:
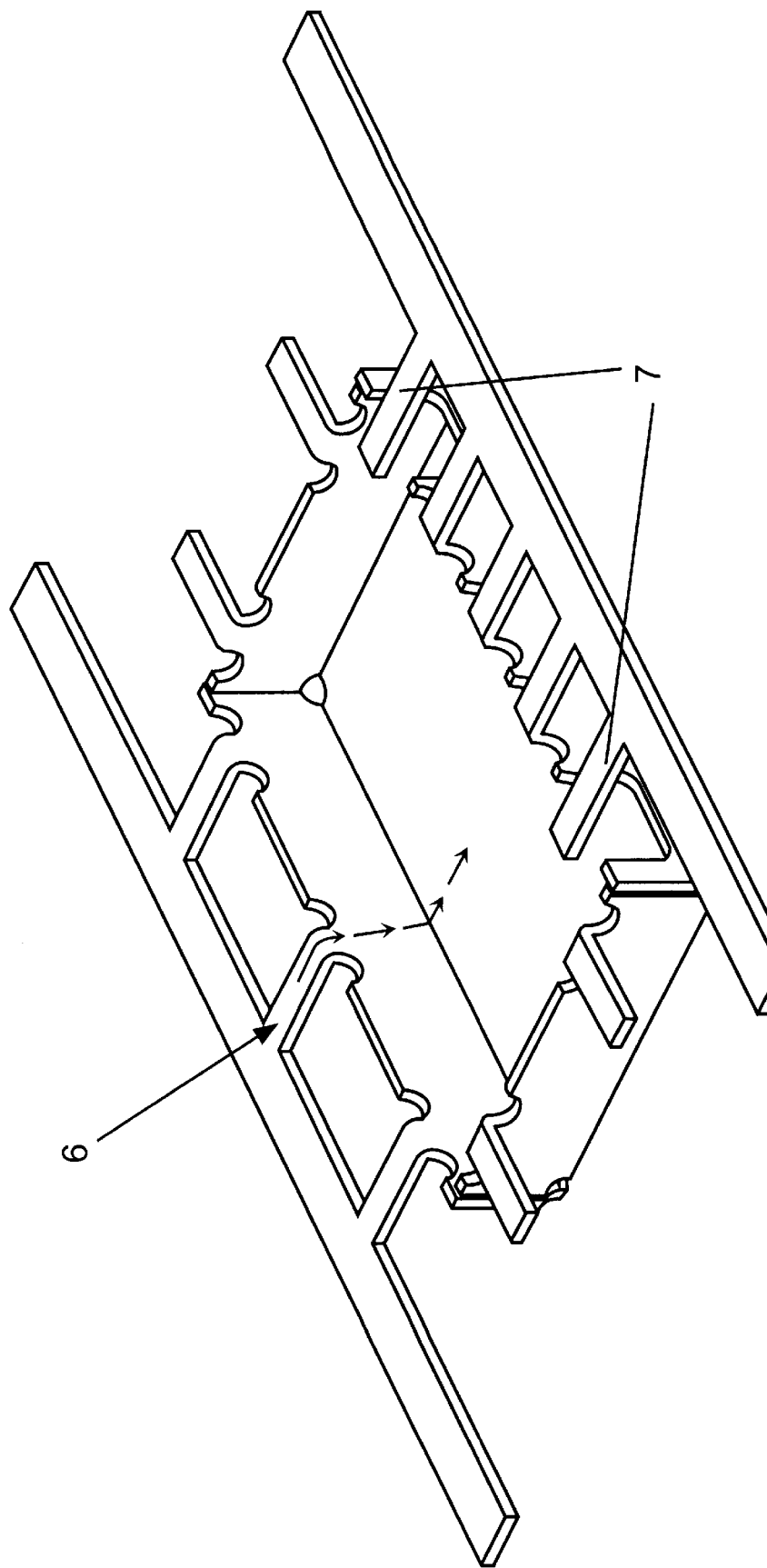
FIG. 6 is the metal bracket prior to lead shear.

Preferably, the open face or access port of such a structure will be on the bottom face of the filter as it is finally configured. That is, the open face of the filter with exposed, solidified, void-filling material will face the circuit board. The filter ground leads 6 are bent perpendicular to the wall of the filter such that they are substantially coplanar with the open face of the filter and the surface of the circuit board. The ground leads 6 then serve as the electrical ground connection and structural anchor affixing the filter to the circuit board. Two input/output leads 7, still at this point a part of the bracket, are soldered to the input/output filter internal components. After soldering these input/output leads 7 to the internal components, they and the ground leads 6 are sheared off the bracket to a prescribed length. See FIG. 6. The circuit board ground plane provides the lid, per se.

The SMT filters of the present invention are constructed by a method involving inserting and affixing the filter internal components inside a metal housing having an access port; adjusting and testing the internal components through the access port; and filling the interior of the metal bracket with a void filling material. The metal bracket is preferably inserted into a housing before the void-filling material fills the interior of the metal bracket. Even more preferably the bracket is simply pressed into the housing. In this manner, the loss or seepage of void-filling material is eliminated or reduced.

The void filling material might be any fluid material that will flow around the filter internal components, fill in the void spaces, and subsequently solidify. Preferably the void-filling material will be inert, stable, and solid under the conditions that the filter will likely be exposed in normal use. Moreover, the void-filling material should be such that it does not substantially expand or contract on solidification, nor should it electrically alter the circuit. More particularly, the void filling material should be inert, stable, capable of low dielectric loss, low water absorption, capable of surviving reflow soldering at 245° C. (i.e., solid to temperatures of at least about 250° C.), rigid after cure in order to hold the components, matches the thermal coefficient of expansion to the components, has low cost, and is machine dispensible. A commercially available example of such material is HYSOL FP 4450 (Dexter Corporation, Electronic Materials Division).

A preferred void-filling material is an epoxy. Alternatively, an appropriately selected thermoset or thermoplastic material might be used as the void-filling material. The void filling materials will necessarily be chosen with due consideration given to the materials used in the filter and the conditions the filter will experience in its end use. The selection of appropriate void-filling materials will be a matter of routine selection for one of ordinary skill in the art.

The void-filling material, whether epoxy or plastic, can be injected or otherwise placed within the interior of the bracket with automated dispensing equipment. The housing surrounding the metal bracket and filter internal components has the primary purpose to reduce and eliminate seepage of epoxy out of the gaps of the folded bracket. In the case of an epoxy, the epoxy is then heat cured, and the filter is ready for final testing. The foregoing steps can be effected with automated equipment such as automated parts handlers and test equipment.

Thus, in one preferred embodiment, the SMT filter of the present invention comprises: a polymeric external housing; a metal bracket; filter internal components; electrical leads; and a temperature matched fixative epoxy, wherein the polymeric housing surrounds the metal bracket, and said housing and said bracket are configured such that at least one planar surface of said filter is open faced with respect to said housing and said bracket; the filter internal components are affixed, and electrically connected, to the interior of the metal bracket; the epoxy surrounds and structurally supports the filter internal components; and the electrical ground leads are an integral part of, and electrically connected to, the metal bracket.

The foregoing SMT filter configuration and method of manufacture provides a means for automated, high-throughput manufacture of filters.

In one embodiment the internal components are mounted in the open-faced cubic metal bracket by automated pick and place machinery and soldered by robot soldering. Once the internal components are inserted and mounted in the bracket within the plastic cube, the leads are sheared, the filter is flipped upside down, tested and adjusted on conventional test equipment with ample access to the filter internal components. Either before or after adjustment, the metal bracket is inserted within an open-faced cubic housing. The metal bracket/filter is then filled with a temperature-matched fixative epoxy. This epoxy filler material completely surrounds, affixes, and insulates the adjusted components. The components are thus held in place by the solidified epoxy, which has the added advantage of adding structural integrity to the form of the thin bracket. The filter is then ready to be mounted on a circuit board. Once mounted on the end user's circuit board (with ground plane on that circuit board) the filter becomes completely shielded.

What is claimed is:

1. A surface-mount filter comprising:
   a. an external housing;
   b. a metal bracket;
   c. filter internal components, wherein said metal bracket provides a shield to said filter internal components;
   d. electrical leads, including at least one electrical ground lead and at least two electrical input/output leads; and
   e. an inert, solidified void-filling material, wherein said housing surrounds said metal bracket; said filter internal components are affixed and electrically connected to the interior of said metal bracket and adjusted within said metal bracket; said inert void-filling material surrounds, affixes and structurally supports said adjusted filter internal components; and said at least one electrical ground lead is an integral part of, and electrically connected to, said metal bracket.

2. The surface mount filter of claim 1, wherein at least one face of said filter is uncovered by said housing.

3. The surface mount filter of claim 1, wherein said void filling material is selected from among the group consisting of a thermoset polymer, a thermoplastic polymer, and an epoxy.

4. The surface mount filter of claim 3, wherein said void-filling material is inert, stable and solid to temperatures of at least about 250° C.

5. The surface mount filter of claim 1, wherein said filter is an open faced hexahedron.

6. The surface mount filter of claim 1, wherein said filter internal components are selected from among the group consisting of chip capacitors, chip inductors, air wound coils, toroidal wound coils, and combinations thereof.

7. The filter of claim 1, wherein said filter internal components are completely surrounded in a grounded shield, upon connecting said filter to a circuit board.

8. The filter of claim 1, wherein said housing is capable of surviving reflow soldering temperatures of 254° C.

9. The filter of claim 1, wherein said housing is capable of surviving 100 psi ultrasonic pressure washing.

10. A surface-mount filter comprising:
 a. a polymeric external housing;
 b. a metal bracket;
 c. filter internal components, wherein said metal bracket provides a shield to said filter internal components;
 d. electrical leads, including at least one electrical ground lead and at least two electrical input/output leads; and
 e. a temperature matched fixative epoxy, wherein said housing surrounds said metal bracket and said housing and said metal bracket are configured such that at least one planar surface of said filter is open faced with respect to said housing and said metal bracket; said filter internal components are affixed and electrically connected to the interior of said metal bracket and adjusted within said metal bracket; said epoxy surrounds, affixes and structurally supports said filter internal components; and said at least one electrical ground lead is an integral part of, and electrically connected to, said metal bracket.

* * * * *